(12) United States Patent
Bock et al.

(10) Patent No.: US 12,292,491 B2
(45) Date of Patent: May 6, 2025

(54) APPARATUS AND METHOD FOR MAGNETIC RESONANCE IMAGING AND/OR MAGNETIC RESONANCE SPECTROSCOPY

(71) Applicant: Albert-Ludwigs-Universitaet Freiburg, Freiburg (DE)

(72) Inventors: Michael Bock, Heidelberg (DE); Ali Caglar Oezen, Kirchzarten (DE)

(73) Assignee: Albert-Ludwigs-Universitaet Freiburg, Freiburg (DE)

(*) Notice: Subject to any disclaimer, the term of this patent is extended or adjusted under 35 U.S.C. 154(b) by 156 days.

(21) Appl. No.: 18/256,607

(22) PCT Filed: Dec. 8, 2021

(86) PCT No.: PCT/EP2021/084766
§ 371 (c)(1),
(2) Date: Jun. 8, 2023

(87) PCT Pub. No.: WO2022/122812
PCT Pub. Date: Jun. 16, 2022

(65) Prior Publication Data
US 2024/0036130 A1    Feb. 1, 2024

(30) Foreign Application Priority Data
Dec. 10, 2020 (EP) .................................. 20020605

(51) Int. Cl.
G01R 33/36    (2006.01)
G01R 33/341   (2006.01)

(52) U.S. Cl.
CPC ....... G01R 33/3692 (2013.01); G01R 33/341 (2013.01); G01R 33/3621 (2013.01)

(58) Field of Classification Search
CPC .............. G01R 33/3692; G01R 33/341; G01R 33/3621; G01R 33/34007; G01R 33/3415
See application file for complete search history.

(56) References Cited

U.S. PATENT DOCUMENTS

| 2003/0057944 | A1  | 3/2003  | Van Helvoort et al. |
| 2007/0164746 | A1* | 7/2007  | Jevtic ................. G01R 33/3692 324/322 |
| 2010/0022867 | A1  | 1/2010  | Fukuchi |
| 2012/0146646 | A1  | 6/2012  | Manipatruni et al. |
| 2021/0396823 | A1* | 12/2021 | Ortiz ................. G01R 33/3692 |

FOREIGN PATENT DOCUMENTS

WO    2019154641 A1    8/2019

* cited by examiner

Primary Examiner — G. M. A Hyder

(57) ABSTRACT

The present invention relates to a coil device for magnetic resonance imaging and/or magnetic resonance spectroscopy. The present invention further relates to a coil array of such coil devices. Moreover, the present invention relates to a power supply device for a coil device for magnetic resonance imaging and/or spectroscopy as well as to a signal receiving device for a coil device for magnetic resonance imaging and/or spectroscopy. Furthermore, the present invention relates to an apparatus for magnetic resonance imaging and/or magnetic resonance spectroscopy as well as to a method for performing magnetic resonance imaging and/or magnetic resonance spectroscopy.

17 Claims, 12 Drawing Sheets

Figure 1:
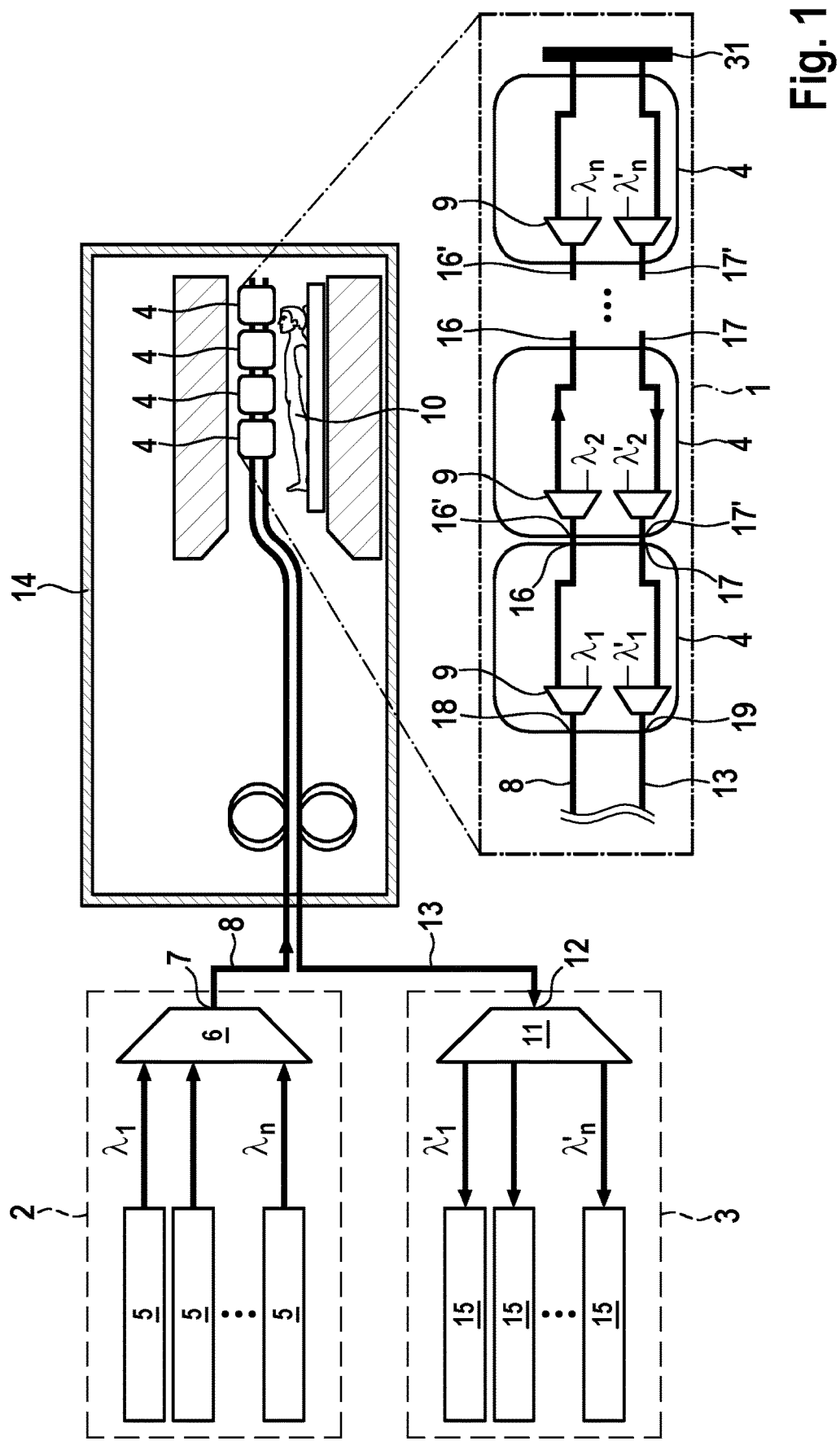

APPARATUS AND METHOD FOR MAGNETIC RESONANCE IMAGING AND/OR MAGNETIC RESONANCE SPECTROSCOPY

The present invention relates to a coil device for magnetic resonance imaging and/or magnetic resonance spectroscopy. The present invention further relates to a coil array of such coil devices.

Moreover, the present invention relates to a power supply device for a coil device for magnetic resonance imaging and/or spectroscopy as well as to a signal receiving device for a coil device for magnetic resonance imaging and/or spectroscopy.

Furthermore, the present invention relates to an apparatus for magnetic resonance imaging and/or magnetic resonance spectroscopy as well as to a method for performing magnetic resonance imaging and/or magnetic resonance spectroscopy.

The basic principle on which magnetic resonance imaging (MRI) and magnetic resonance spectroscopy are based is identical, for the sake of simplicity the term magnetic resonance imaging will be used in the following, although this also applies to magnetic resonance spectroscopy. In MRI radio frequency (RF) fields are used for exciting the magnetization in the object to be inspected (e.g. in a patient's body) and for acquiring the MR signal. These RF fields are generated and detected by RF coils (i.e., probes, resonators, or antennas). An RF coil in MRI can be designated for transmitting (Tx) only, for receiving (Rx) only, or for both transmitting and receiving (Tx/Rx) operations. Typically, MRI systems employ Rx RF coils that are designed for specific parts of the human body (e.g., head and neck coils, spine coils, extremity coils, or interventional tracking coils), as these coils most-optimally detect the low MRI signal in the specific anatomical region they are designed for.

MR sensitivity can be increased by using local coils or coil arrays, which can consist of different coil elements, in the form of the underlying anatomical area to improve the final image quality. Common design approaches for such coils are in form of surface Rx coil arrays with multiple elements, which not only provide a high local MR signal but also can be used to increase the acquisition speed by so-called parallel imaging techniques.

Conventional coil devices often are very expensive and are typically available as complete arrays specifically configured for a particular anatomical region. As a result, in order to establish an MRI system suitable for serving a multitude of different objectives, a multitude of dedicated coil arrays need to be purchased. In such conventional arrays, the conducting elements of each device or array must be covered with isolating materials (e.g., hard or soft plastic) to ensure patient safety. The hard covering of the coil elements and the connection cables results in a rigid volume device that is heavy and uncomfortable. Alternatives to hard-covered coils are coil devices constructed from thin flexible materials and/or comprising flexible wires such that they can fit tightly to the patient and are lightweight. However, the configuration of these coil arrays is fixed and a predefined number of coil elements is embedded in the structure such that the arrangement of the individual elements cannot be changed. For improved sensitivity, it is desired that the coil array closely surrounds the anatomy of interest. On the other hand, the array must also fit a large variety of anatomical sizes. The resulting size and the fixed configuration of a conventional coil array limits the attainable sensitivity in some patients and comfort in others.

In general, the performance of a RF coil array is not optimal if the filling ratio of its sensitive volume is not close to 100%. For example, a head coil array with an inner diameter of 25 cm would perform sub-optimally for a patient with a head diameter of 20 cm. More extreme examples of these undesirable effects are seen when performing MRI of pediatric or neonatal patients using standard coil elements or arrays for adults, which totally fail to comply with children's anatomy. However, given the wide Body-Mass-Index (BMI) spectrum of the general population, it has so far not been feasible to build an RF coil array that closely fits every patient. Flexible coils help to increase the signal/noise ratio (SNR) in certain settings. However, it is also not guaranteed that a flexible coil will perform optimally for each patient, because, for example, a coil designed for MRI of an average adult abdomen will still not cover that of female patient pregnant in the third trimenon. Thus, in such a setting MR image quality of the fetus and the placenta would be impaired by non-uniform sensitivity and low SNR.

Another source of the problem of the RF coil arrays is their connection to the MRI system. To transfer the MR signal detected by a coil to the receiver and to energize the integrated pre-amplifiers in the coil interface, coaxial cables must be attached, which are typically plugged into the coil plug connectors available on the MRI system's patient table. These cables add to the overall weight of the coil device and introduce challenges during patient preparation before an MRI exam. Most importantly, they are prone to electromagnetic interferences from the MRI system's body coil, which can potentially result in heating in or on the body of the patient. To avoid such heating, bulky current traps must be integrated to the cables in the coil system. Furthermore, during MRI signal reception, the multiple Rx cables can couple between each other, which introduces additional noise thereby potentially reducing the overall SNR.

Embodiments of the present invention therefore address the problem of improving and further developing a coil device, a coil array, a power supply device, a signal receiving device and an apparatus for magnetic resonance imaging and/or magnetic resonance spectroscopy such that an improved compatibility with objects of various sizes and/or shapes is achieved, and that the electromagnetic coupling to the conducting cables is eliminated. Embodiments of the present invention further address the problem of improving and further developing a method for performing magnetic resonance imaging and/or magnetic resonance spectroscopy such that an improved compatibility with objects of various sizes and/or shape is achieved, and that electromagnetic coupling to the conducting cables is eliminated.

In a first aspect, the present invention provides a coil device for magnetic resonance imaging and/or magnetic resonance spectroscopy comprising at least one radio frequency coil, at least one optical power connector connectable to a corresponding optical power connector of a second coil device, at least one optical signal connector connectable to a corresponding optical signal connector of said second coil device and at least one fixation element for physically connecting said coil device to said second coil device.

In a second aspect, the present invention provides at least two coil devices connected to each other, wherein each coil device is a coil device according to the first aspect.

In a third aspect, the present invention provides a power supply device for a coil device for magnetic resonance imaging and/or magnetic resonance spectroscopy, preferably for a coil device according to the first aspect, comprising at least two light sources emitting light of different optical wavelength, a multiplexer and a single optical connector connectable to a corresponding power connector of said coil device.

In a fourth aspect, the present invention provides a signal receiving device for a coil device, preferably for a coil device according to the first aspect, comprising a multiplexer, a single optical connector connectable to a corresponding signal connector of said coil device and at least two receiver channels being directly or indirectly connected to said multiplexer.

In a fifth aspect, the present invention provides an apparatus for magnetic resonance imaging and/or magnetic resonance spectroscopy comprising a coil array of the second aspect, a power supply device, preferably according to the third aspect, and a signal receiving device, preferably according to the fourth aspect.

In a sixth aspect, the present invention provides method for performing magnetic resonance imaging and/or magnetic resonance spectroscopy, preferably by using an apparatus according to the fifth aspect, comprising the following steps:
 assembling a coil array by connecting at least two coil devices such that said coil array is configured in accordance with the size and/or shape of an object to be inspected,
 connecting an optical power supply device and an optical signal receiving device to said coil array, and
 performing said magnetic resonance imaging and/or magnetic resonance spectroscopy.

One of the main advantages of the invention is that individual coil devices can be combined, i.e. mechanically connected, into a coil array in a modular fashion, such that coil arrays customized with respect to their size and shape can be assembled easily. Hence, the array can be specifically configured based on the size and/or shape of the object to be inspected, e.g. the size and shape of a patient. Therefore, with a set of a certain (relatively small) number of coil devices (i.e. modules), it is possible to assemble a whole variety of different coil arrays customized for objects, e.g. patients, of almost all shapes and sizes—not dissimilar to the variety of differently shaped and sized configurations that can be achieved with a set of a small number of Lego-like building blocks. Since these coil arrays match the size and/or shape of the object the SNR is reduced without having to invest into a whole collection of expensive coil devices or coil arrays of different geometry and size.

A further advantage of the power supply device and the signal receiving device is that no electricity-conducting cables need to be used which simplifies the connection technology and improves the safety and the SNR of the MR signal. If the MR signal is converted to an optical signal directly at the output of the coil device, coupling between the cables and from the transmitted pulses, electrical signal loss and electromagnetic interference are avoided. In addition, carrying a signal from all the coil devices over a single optical fiber instead of multiple coaxial cable reduces the complexity and the weight of the whole system. According to a further advantageous embodiment, wavelength-division multiplexing is used to transfer an optical signal of at least one coil device, preferably at least two coil devices, i.e. a coil array, over a single optical fiber. According to another further advantageous embodiment, wavelength-division multiplexing is used also to power up and to control the active elements in the coil system, e.g., switching diodes and low noise preamplifiers, optically, over a single optical fiber.

The disclosure of this patent application also includes in a seventh aspect a power supply device for a coil device for magnetic resonance imaging and/or magnetic resonance spectroscopy, preferably for a coil device according to the first aspect, comprising a multispectral light source and an optical connector, preferably a single optical connector, connectable to a corresponding power connector or said coil device. This power supply device may further comprise the features and advantages described with regard to the power supply device according to the third aspect.

It is noted that the embodiments according to the first to seventh aspect may also be used for electron-spin-resonance spectroscopy and electron-spin-resonance imaging.

The term "connectable" in the context of the present application refers to a direct connection or an indirect connection, i.e. two connectors can be designed such that they are connected to each other (direct connection) or such that a further element, for example an optical fiber, can be arranged between two connectors (indirect connection.

The expression "optical fiber", in the context of the present application means any kind of physical structure suitable for transmitting light, for example—but without limitation—fibers made of glass or plastic.

According to a further embodiment, the radio frequency coil can be made of a highly conductive material (e.g. copper or silver) and/or can be in the form of loops of cylindrical wires or planar ribbons. Alternatively or additionally, at least one coil device can be connected to a power supply device and/or a signal receiving device and/or a further coil device with an optical fiber. The optical fiber can be made of glass or plastic.

In a further embodiment, the coil device comprises a housing. The housing can be designed such that essentially all components of the coil device are encased in the housing. The housing can be a rigid housing or a flexible housing. This has the advantage that mechanical stability of the coil device is provided and that it is possible to clean or even sterilize the coil device. Furthermore, the power connector and/or the signal connector can be a plug-in connector are integrated into the housing and/or can even be an integral part of the housing.

According to a further embodiment, the power connector and/or the signal connector can be a plug-in connector. Alternatively or additionally, the fixation element can be designed to achieve a form-fit and/or friction fit physical connection between the coil devices. The fixation element can also be designed for an indirect connection between the coil devices, i.e. a further module, which can comprise connecting elements with one or more optical fibers, can be arranged between the fixation elements of the coil devices being connected to each other. According to a further embodiment, the optical power connector and/or the optical signal connector may be configured to constitute said fixation element. Additionally or alternatively, the optical power connector and/or the optical signal connector may comprise a color-coding and/or form-coding such that only matching coil devices are connected to each other.

In a further embodiment, the coil device comprises multiple power connectors and/or signal connectors and/or fixation elements, e.g. at different sides of the coil device, such that a second coil device can be connected to the coil device in various positions. This has the advantage that modular coil devices can be connected to each other such as to specifically match the shape and size of the object to be inspected, thereby to ensure high-quality MR imaging or spectrometry results.

According to a further embodiment, the coil device further comprises a second power connector connectable to a power supply device and/or a second signal connector connectable to a signal receiving device. An advantage of such a design is that power can be provided to the coil device, while MR signals detected by the coil device can be transmitted to a receiving device for further processing e.g. for calculating an image.

In a further embodiment, said power connector and/or said second power connector and/or said signal connector and/or said second signal connector is/are an optical connector. This has the advantage that light can be used for energizing the coil device and/or for signal transmission of the signal detected by the coil device. Hence, the use of galvanic connections between the coil devices and/or the power supply device and/or the signal receiving device is not necessary. This has the advantage that cross-talk and electromagnetic interference is prevented.

According to a further embodiment, the coil device further comprises at least one wavelength extraction element, for example a wavelength splitter or a dichroitic mirror or an optical circulator with a distributed fiber bragg grating. Hence, the coil device being sensitive to a single, pre-defined optical wavelength (color) can extract light from this particular wavelength, e.g. for energizing the coil device. The remaining light could be passed on to a further coil device connected with the before described coil device. Alternatively or additionally, the coil device further comprises at least one division multiplexer for coupling the signal into the signal being transmitted to the signal receiving device. Therefore, the information from all coil devices may be transmitted over a single optical fiber. Individual coil devices may encode the MR signal via photo-detectors, or by modulating continuous wave light delivered from the source via multiplexers, for example using acousto-optical coupling or using Pockel's effect. The optical MR signal transmission may rely on the dense or coarse wavelength division multiplexing principle. If all coil devices comprise at least one wavelength extraction element and at least one wavelength division multiplexer, a coil array comprising a unique combination of coil devices can be created. Further, this coil array can be connected to a single optical connector of a power supply device and a single optical connector of a signal receiving device, whereas no separate wiring for signal or power transmission is needed.

In a further embodiment, said coil device further comprises at least one electrical to optical converter, for example a photo-diode. Thereby light energy can be converted into electrical power, which can be used to energize all active elements of the coil device. Alternatively or additionally, said coil device further comprises at least one optical to electrical converter, for example a light emitting diode, which can be used to convert the signal generated by the radio frequency coil into an optical signal.

According to a further embodiment, the coil device further comprises at least one digitizer and/or at least one de-modulator and/or at least one pre-amplifier and/or at least one tuning and matching circuit. A tuning and matching circuit has the advantage, that the radio frequency coil can be tuned to the resonance frequency, whereas a low MR signal can be amplified by a pre-amplifier. The analog MR signal can be de-modulated and digitized or directly digitized at the carrier frequency by a digitizer unit.

In a further embodiment, the coil device comprises an active detuning element, for example a positive intrinsic negative diode (PIN-diode) or a photo field effect transistor (photoFET). During MRI, a receiver RF coil needs to be detuned during Tx (i.e., RF excitation) and tuned during Rx (i.e., data acquisition). An advantage of active detuning is that noise is reduced, which would be generated during active tuning due to the series resistance of the switching components. Also, to avoid an additional optical electrical conversion, active detuning by optical means may be used. Known MRI systems supply 10V for biasing of active detuning circuits and powering of low noise amplifiers at 100 mA. A PIN-diode, can also be effectively switched at 3V and 20 mA. As an alternative to PIN diodes, FET switches may be used at lower current rates. It was tested to replace the active detuning system implemented with PIN-diodes by photoFET on a single coil device. PhotoFETs can be optically switched, and thus do not require conversion of optical power to electrical (OEC) for biasing a PIN diode. Hence, a photoFET can simplify the system and reduce the number of electronics. Besides, use of photoFETs reduces the total power requirements. Passive detuning using cross-diodes may be implemented additionally. Hence, in case the active detuning fails, the coil elements are detuned by this complementary method. To avoid doubling the optical power sources and controllers, an active detuning component and an amplifier may be supplied from the same power source. They may function with an inverted logic. During Tx, active detuning component (e.g. photoFET) may be powered, but the amplifier is not, and during Rx, vice versa.

According to a further embodiment, the pre-amplifier is a low-power, low-noise low-input-impedance amplifier. This has the advantage that high-channel-count Rx arrays, e.g. 64 channels or 128 channels, can be optically powered. Preferably the low-power, low-noise low-input-impedance amplifier may be a two-stage amplifier comprising a high electron mobility transistor (HEMT) for the first stage and bipolar junction transistor (BJT) for the second stage. This has the advantage that the low noise amplifier can be supplied with power directly by using an optical to electrical converter, for example a light emitting diode, and prevent using a voltage converter and/or regulator on the coil device. Therefore, the number of components on the coil device is reduced and electromagnetic interference from voltage converters is avoided. Said low noise amplifier can match the noise figure performance of known low noise amplifiers, but can work optimally with lower voltage and power ratings.

In a further embodiment, said coil device further comprises a reflecting element, for example a mirror. Providing a reflecting element has the advantage that the light beam will be reflected, if no further coil devices are connected afterwards. This might be used to trigger the shutdown of a light source providing light of a wavelength for a not-connected coil device. Alternatively, an optical absorber, for example a beam dump, preferably a beam block or a beam trap, can be arranged, for example, at the end of the optical fiber serving as a power line. The MR signal generated by the coil array can be used to identify each individual coil device in the array, since each coil device is adapted to convert the MR signal generated into a specific pre-defined wavelength uniquely assigned to the respective coil device. As a result, the presence of this pre-define wavelength in the MR signal transmitted from the array serves as a unique identifier of the individual coil device. If one of the pre-defined wavelengths is not present in the array's MR signal, the respective coil device is not attached to the array and the corresponding light source can be shut down. This has the advantage that the light source is not disrupted or compromised by reflected light. A skilled person understands that the reflecting element and the absorbing element can be designed as separate entities, not being an integral part of the coil device. In view of the above a skilled person understands that it is possible to deactivate a specific coil device by shutting down the light source providing light of a wavelength for this coil device, whereas a deactivated coil element also has to be detuned to prevent disturbing the transmit field during radio frequency excitation during an MRI measurement.

According to a further embodiment, said at least one radio frequency (RF) coil is designed for transmitting operations and/or for receiving operations. With other words, the radio frequency coil can be designed for transmitting (Tx) only, for receiving (Rx) only, or for both transmitting and receiving (Tx/Rx) operations.

In a further embodiment, one of said coil devices of said coil array is designed as a main coil device connected to said power supply device and said signal receiving device. Hence, the main coil device can be directly connected to the power supply device and the signal receiving device and might also be connected to a further coil device.

According to a further embodiment, at least one of said coil devices of said coil array is designed as an intermediate coil device connected to said main coil device. The intermediate coil device might also be connected to a further intermediate coil device and/or to an end coil device.

In a further embodiment, one of said coil devices is designed as an end coil device being connected to said main coil device and/or to any one of said intermediate coil devices. The end coil device typically only has an input power connector connectable to a corresponding connector of an intermediate coil device and/or to a corresponding connector of a main coil device and an output signal connector connectable to a corresponding connector of an intermediate coil device.

According to a further embodiment, said coil array is connected to said power supply device with a single optical fiber and/or wherein said coil array is connected to said signal receiving device with a single optical fiber. Hence, no conducting cables need to be used, which improves the safety and SNR of the array, and simplifies the mode of connection. The optical fiber can be made of glass or of plastic. Furthermore, said connection of said coil array to said signal receiving device can be implemented wirelessly. For example, the MR signal can be encoded as amplitude modulation of light, which can be detected from a distance by a light sensor, for example, a CMOS light sensor.

In a further embodiment, the power supply device is designed for providing sufficient optical power to energize at least some elements of the coil devices, e.g. at least pre-amplifiers of the coil devices. Therefore, it is advantageous, if the optical power is sufficient to energize pre-amplifiers, which typically require power levels of several tens of milliwatts. For this, the power supply device can comprise several laser diodes as light sources.

In a further embodiment, said power supply device comprises at least one light source and wherein said at least one light source is activated only during a receiving cycle. This design accomplishes an active detuning without additional control signals or direct current cables. Alternatively or additionally, a test pulse of different wavelength is transmitted to the coil array for identifying the coil devices assembled to constitute the given coil array. Each individual (i.e. modular) coil device (i.e. each module) of the coil array is adapted to extract only a pre-defined wavelength uniquely assigned to the respective coil device from the test pulse such that the signal transmitted back from the coil array can be used to identify each individual coil device used in the given array. Hence, an auto calibration of the apparatus can be performed on basis of the result of this test routine. Alternatively, the MR signal transmitted from the coil array can be used to identify each individual coil device, since each coil device is adapted to transmit only a pre-defined wavelength uniquely assigned to the respective coil device. If no signal is received for one of the pre-defined wavelengths, the respective coil device is not attached to the array.

Figure 2:
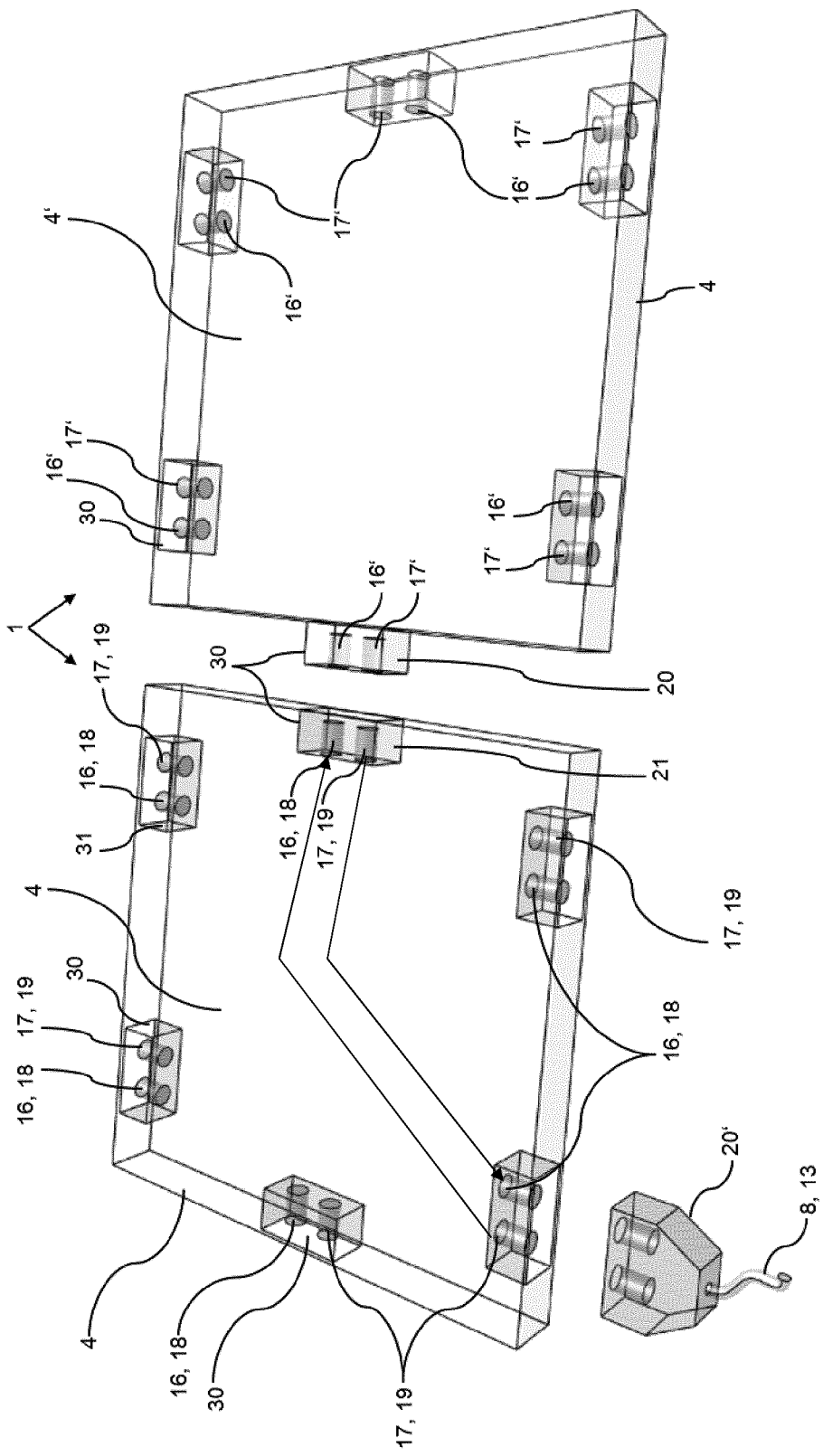
Figure 3:
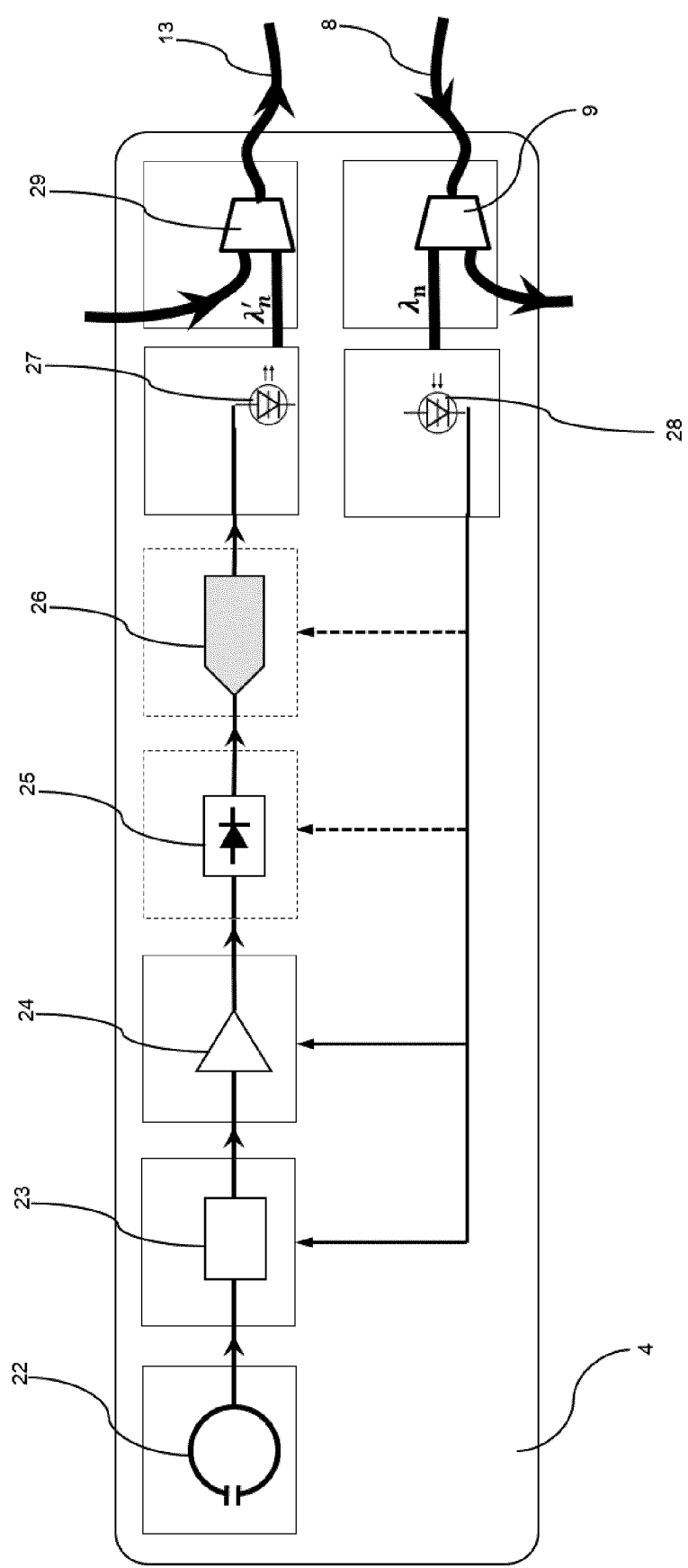
Figure 4:
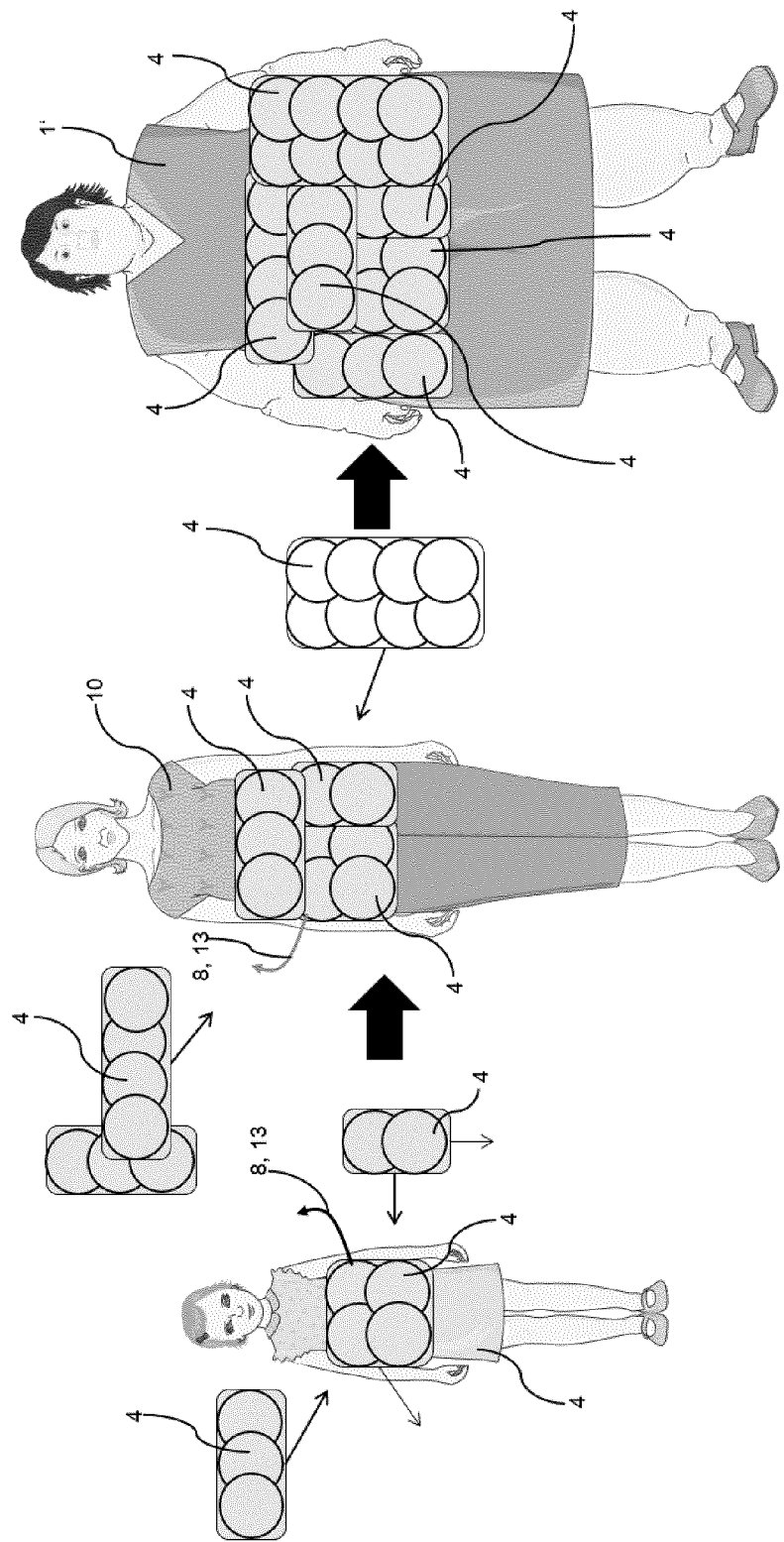

There are several ways how to design and further develop the teaching of the present invention in an advantageous way. To this end, it is to be referred to the patent claims subordinate to patent claim 1 on the one hand and to the following explanation of preferred examples of embodiments of the invention, illustrated by the drawings on the other hand. In connection with the explanation of the preferred embodiments of the invention by the aid of the drawings, generally preferred embodiments and further developments of the teaching will be explained. In the drawings FIG. 1 shows in a schematic view an apparatus according to an embodiment, FIG. 2 shows in a schematic view a coil array according to an embodiment, FIG. 3 shows in a schematic view a coil device according to an embodiment, FIG. 4 shows in a schematic view several coil arrays for inspecting patients of different sizes, and FIGS. 5 to 11 show an experimental concept as well as experimental results obtained by applying an embodiment of the present invention.

FIG. 1 is shows an apparatus for magnetic resonance imaging and/or magnetic resonance spectroscopy comprising a coil array 1, a power supply device 2 and a signal receiving device 3. The coil array 1 comprises four coil devices 4 and is arranged at the object 10 to be inspected, e.g. a patient. A skilled person understands that the coil array 1 can also comprise a different amount of coil devices 4, but must comprise at least two coil devices 4. The coil device 4 arranged on the left side of the array shown in FIG. 1 is designed as a main coil device and comprises a power connector 16 connectable to a corresponding power connector 16' of a second coil device 4 and a signal connector 17 connectable to a corresponding signal connector 17' of a second coil device 4. The coil device 4 further comprises a second power connector 18 connectable to the power supply device 2 and a second signal connector 19 connectable to the signal receiving device 3.

The coil device 4 arranged on the right side of the array shown in FIG. 1 is designed as an end coil device and comprises a power connector 16' connectable to a corresponding power connector 16 of a second coil device 4 and a signal connector 17' connectable to a corresponding signal connector 17 of a second coil device 4. Further, a reflecting element 31 or an absorbing element 31 is connected at the end coil device for reflecting the light beam or for absorbing the light beam. The reflecting or absorbing element 31 can be an integral part of the end coil device, or a separable attachment.

The coil devices 4 being arranged between the main coil device and the end coil device are designed as intermediate coil devices and comprise power connectors 16, 16' connectable to corresponding power connectors 16, 16' of further coil devices 4 and signal connectors 17, 17' connectable to corresponding signal connectors 17, 17' of further coil devices 4.

The power supply device 2 comprises multiple light sources 5, e.g. laser diodes, which transfer light through a multiplexer 6, a single optical connector 7 and a single optical fiber 8 to the coil array 1. Every coil device 4 of the coil array 1 is sensitive to a single optical wavelength $\lambda_n$ (color), and only extracts light of this wavelength $\lambda_n$ from the incoming beam with a wavelength extraction element 9. The remaining light is then passed on to the other coil devices 4 via corresponding optical connectors 7.

Each coil device 4 converts the light's energy into electrical power, which is used to energize all active elements of the coil device 4.

The signal receiving device 3 comprises a multiplexer 11 and an optical connector 12, such that a coil array 1 can be connected with a single optical fiber 13.

Hence, only two optical fibers 8, 13 enter and leave the MRI room 14, and there are no metallic cables around the object 10 other than the coil conductors. Signals from coil devices 4 can be combined optically, and then transmitted over an optical transmission line, i.e. optical fiber 13 to the signal receiving device 3, where the signal is de-multiplexed and sent to separate digital receiver channels 15.

FIG. 2 shows in a schematic view a coil array 1 according to an embodiment. The coil array 1 comprises two coil devices 4, 4'. The coil device 4 comprises several power connectors 16 and signal connector 17 connectable to power connectors 16' and signal connector 17' of the second coil device 4'. The power connectors 16 and signal connectors 17 also serve as second power connectors 18 and second signal connectors 19. The power connectors 16 and signal connectors 17 are in pairs integrated in a plug 20 or socket 21. The plug 20 and the socket 21 also serve as fixation element 30 for physically connecting the coil device 4, to the coil device 4'.

The coil device 4 is designed as a main coil device and is connected via plug 20' to the optic fibers 8, 13 of the not shown power supply device and the signal receiving device. Hence, the main coil device 4 is the only coil device 4 that is connected to the MRI system, i.e. the power supply device and the signal receiving device. Hence, each coil device 4 comprises two optical connectors: one for power transfer to the next coil device, one for MR signal transfer to the signal receiving device via other coil devices, through the main coil device, which is the only coil device that is connected to the MRI system FIG. 3 shows in a schematic view a coil device 4 according to an embodiment. The coil device 4 comprises a radio frequency coil 22, i.e. a probe, used to detect an MRI signal, which is connected to a tuning and matching circuit 23 including an active detuning element. Further, a pre-amplifier 24 and, if required, a demodulator and a digitizer 26 are arranged. Further, an electrical to optical converter 27 is arranged, e.g. a light emitting diode for signal transmission. FIG. 3 further shows an optical to electrical converter 28, e.g. a photo-diode, used for empowering the active elements of the coil device 4. Hence, the analog or digital MR signal can be transmitted optically over the signal backbone via a data encoding unit comprising either discrete elements or integrated chips to facilitate optical interfacing.

The signal from each coil device 4 is encoded over a unique wavelength $\lambda_n$". The optical output at a pre-defined wavelength $\lambda_n$" is coupled into the signal receiving device (not shown). In a coil array 1 of the present invention, the optical MR signal of a serially-arranged coil device 4' is combined with the optical output of the coil device 4 as shown in FIG. 3 by using wavelength division multiplexer 29, so that signals from different coil devices 4, which are encoded by different wavelengths, are carried over a single optical fiber 13. At the signal receiving device (not shown), the combined signal can be de-multiplexed in the optical domain, converted back to an electrical signal individually for each wavelength (i.e., for each coil device 4) and then digitized.

Furthermore, a wavelength extraction element 9 is arranged for extracting a signal with the wavelength $\lambda_n$ from the incoming optical signal and for transmitting the extracted optical signal to the electrical converter 28 for powering the active elements.

In each coil device 4 the pre-amplifier 24 and the electro-optical converter 27 may consume, for example, a total electrical power in the range of up to 100 mW. By using known laser diodes and optical to electrical converters, it is possible to transfer 10 W of electrical power over an optical fiber. According to the embodiment, however, instead of carrying all the power over one wavelength and then distributing it, each coil device 4 will be powered by a different pre-defined wavelength $\lambda_n$. Starting from the power connector 16, the multiplexed optical power is filtered and the corresponding wavelength $\lambda_n$ is extracted, whereas the remaining light beam continues to the next coil device 4, for example along the same optical fiber 8. In the next coil device 4 the corresponding wavelength $\lambda_m$ of the optical power is extracted and the remaining light beam continues. If there is no coil device 4 connected afterwards, the beam can be reflected or absorbed, which might be used to deactivate the corresponding light source(s) 5.

To accomplish active detuning without additional control signals or DC cables the light sources 5 can be triggered, and activated only during the receive cycle. The tuning of the coil devices 4 can be synchronized with the Rx cycle, i.e., the coil device is actively tuned as opposed to the conventional actively detuned state. A simple realization of this configuration is to connect a PIN diode in series or in parallel with a matching or tuning capacitor. Alternatively, an additional optical control signal can be used to bias PIN diodes during Tx cycle for conventional active detuning.

FIG. 4 shows in a schematic view several coil arrays 4 for inspecting objects 10 e.g. patients, of different shapes and/or. According to an embodiment of the method of the present invention, the coil array 1 is assembled by connecting at least two coil devices 4 such that said coil array 1 is configured in accordance with the size and shape of the object 10, in this case the abdomen of the patient. Further, the coil array 4 is connected to a power supply device and a signal receiving device and the magnetic resonance imaging and/or the magnetic resonance spectroscopy is performed. It can further be seen, that branching of the individual coil devices is possible, i.e. the individual coil devices are not only combined linear (uni-directional).

Figure 5A:
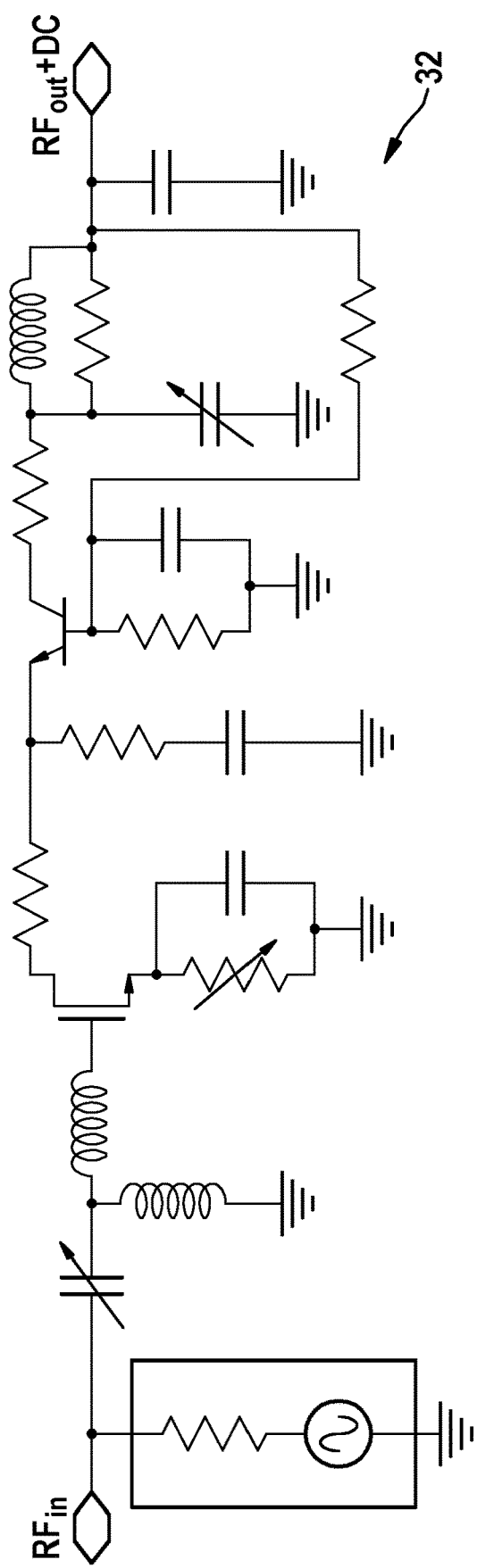

To further reduce power requirements, a low-power, low-noise, low-input-impedance amplifier was designed which requires only 20 mW (FIG. 5A). Feasibility of optical powering was tested. MRI measurements using a coil device was performed in a phantom and a volunteer measurement. FIG. 5A) shows an simplified circuit scheme of an embodiment of a low-power, low-noise, low-input-impedance amplifier 32. The first stage is realized by a GaAs HEMT, and the second stage is by a BJT. DC bias is coupled to the RF path through the output port. To test the optical to electrical conversion principle using WDM, a two channel WDM system was constructed to power up a dual channel receiving coil (Rx). Here, each coil is represented by a specific wavelength. In this preliminary test setup, a maximum of 3.1 V at 21 mA current was obtained after converting the 1.7 W laser power to electrical power. Use of conventional fiber coupling method can increase the efficiency significantly. This setup was used to demonstrate the wavelength division multiplexing (WDM) principle in a power backbone of a coil device. Since free-space coupling of the laser signal was implemented, the coupling efficiency was low (<10%). This can be improved significantly with direct fiber coupling to the laser sources. For high channel number Rx arrays (e.g. 32, 64, or 128), low-power, low-noise amplifiers with low-input impedances are crucial since a single fiber must be able to hold optical power enough to supply all the coil devices.

Figure 5B:
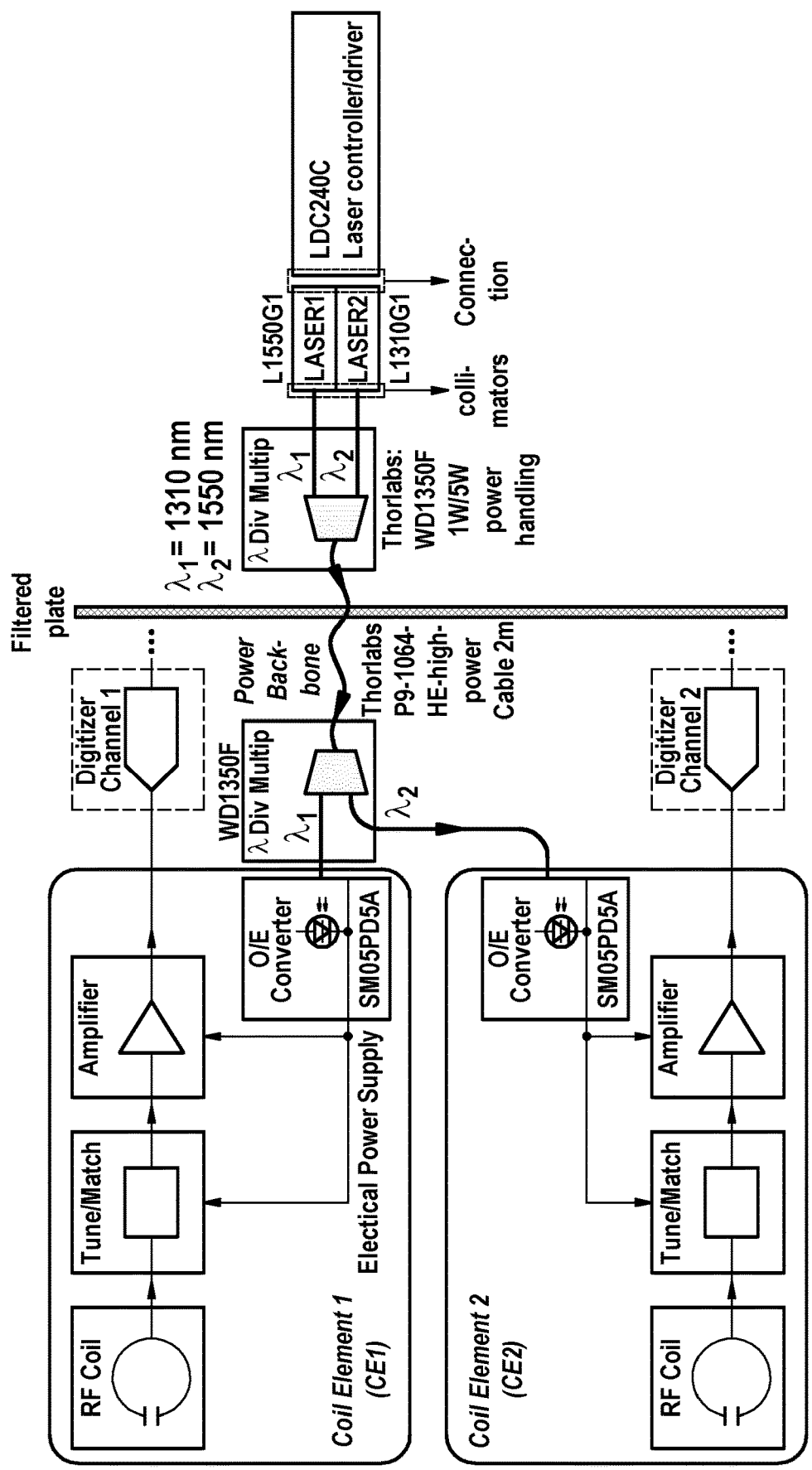

A two-channel power-over-fiber system with WDM was designed to demonstrate the feasibility carrying power over fiber at two different wavelengths (FIG. 5B). Here, two laser sources are combined into a single fiber using WDM and demultiplexed at the coil level to feed the low-power, low-noise, low-input-impedance amplifier via a photo diode. In this demo setup, free-space coupling of the fibers was used and 3.2V was obtained at 17 mA.

For optical detuning, PhotoFETs can be optically switched without the need for optical-to-electrical power conversion to bias a PIN diode (FIG. 6A,B). In FIG. 6C, the setup to demonstrate the feasibility of optical active detuning is shown. To improve coupling efficiency and thus to reduce the optical power requirements, a glass fiber coupler was manufactured. A minimum of 17 mW optical power was needed for sufficient detuning.

Figure 6:
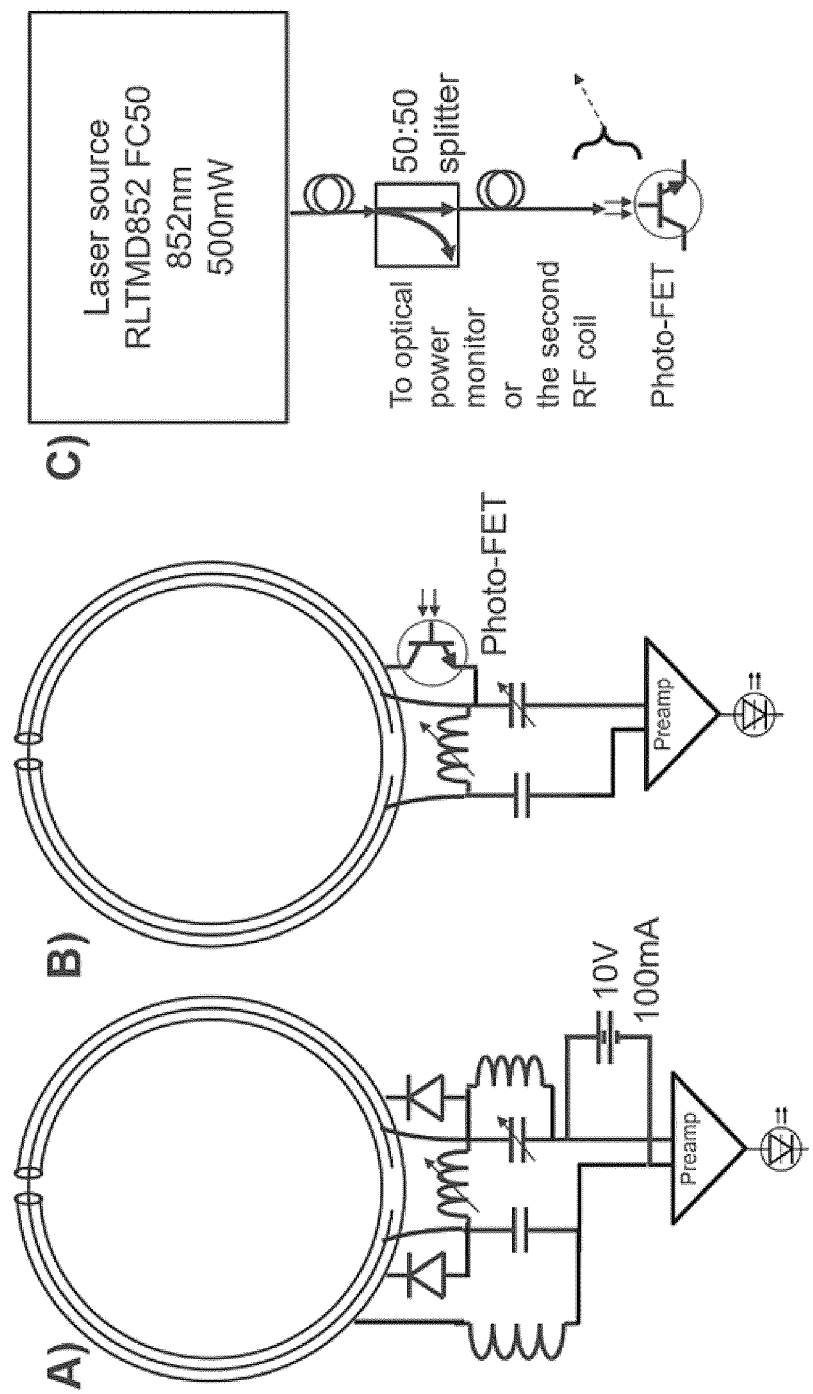

FIG. 6 shows schematics of a detector element with PIN diode detuning (6A) and photoFET detuning (6B). Use of a photoFET will eliminate the need for DC bias network and voltage division between the preamplifier and the active detuning. Schematic of the setup used for optical detuning (6C).

Figure 7:
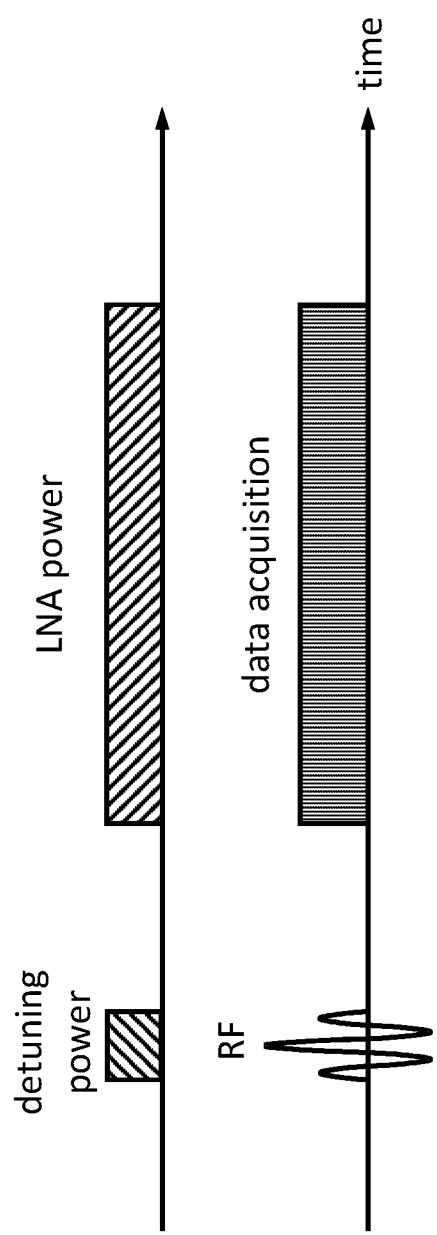

FIG. 7 shows time courses of active detuning and low noise power supply.

Figure 8:
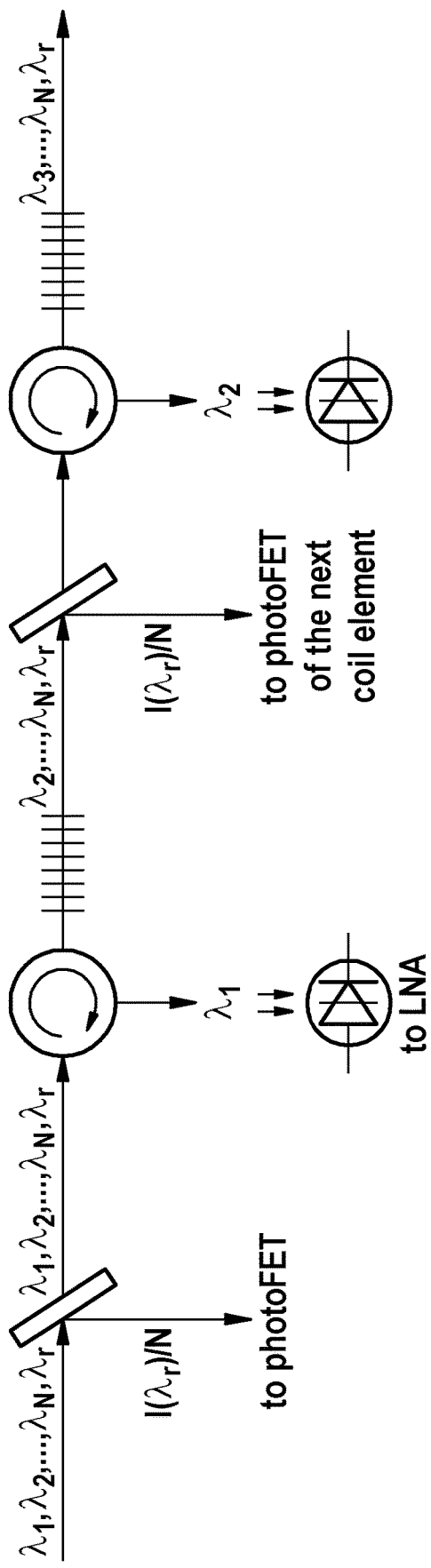

FIG. 8 shows a potential implementation of power over fiber for optical detuning and driving the low-power, low-noise, low-input-impedance amplifiers. All coil devices share the same active detuning signal, yet each coil is powered by light at a specific wavelength. Active detuning can be implemented by optical means using an additional single optical power source and a different wavelength then the existing power sources. An additional wavelength can be used to control the active detuning independently from the main power carrier wavelengths that supply the low-power, low-noise, low-input-impedance amplifier during Rx. A certain amount $(I(\lambda_r)/N)$ can be tapered using e.g. a dichroic mirror to control the active detuning by switching e.g. a photo FET ON during Tx.

Figure 9:
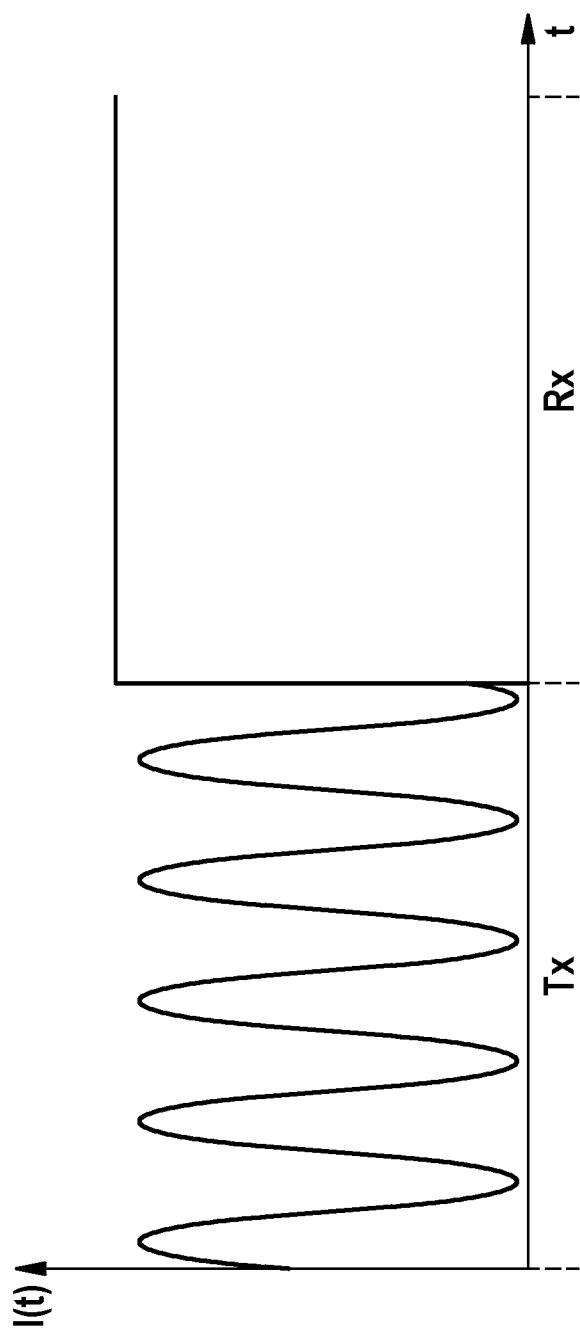

FIG. 9 shows amplitude modulation of the optical power signal to control the low-power, low-noise, low-input-impedance amplifier and active detuning component separately from the same source. Optical power for the specific wavelength (or all of them) will be amplitude modulated during Tx. A passive filter placed at the bias network of the low-power, low-noise, low-input-impedance amplifier will reject the AM signal and the low-power, low-noise, low-input-impedance amplifier will keep the OFF state during Tx. The modulated power signal will be passively rectified and detune the RF coil during Tx. A capacitor placed at the detuning network will avoid the coil to be detuned when during Rx where the optical supply is not modulated but constant (i.e., pure DC).

Figure 10:
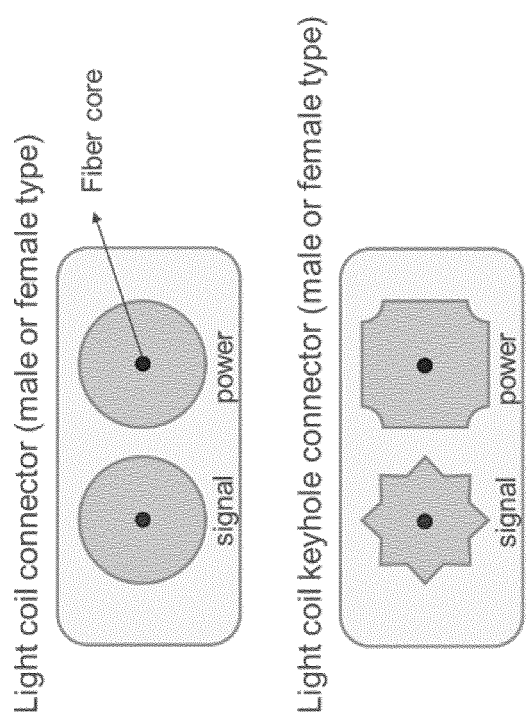

FIG. 10 shows an illustration of form-coded power and signal connectors. One of the requirements of the coil devices is that the coil devices allow for consecutive optical signal and power transmission to implement the modularity, where, each coil device is mechanically attached to the next, without a need for extra cables outside the housing. The main coil device will be the only optical connection between the coil array and the power supply device. A reflector may be placed on the connectors, which will reflect the incoming optical power light when there is no subsequent coil device connected. The reflected light will be measured at the power supply device and a control signal will be sent to the light source controllers to cut the power. Therefore, before each measurement, test signals will be sent out from the light sources and the reflection for each wavelength will be quantified for automated coil device selection and thus to adapt the imaging parameters accordingly (e.g., GRAPPA factor).

Coil devices might have optical components e.g. fiber Bragg gratings, filters, AWGs . . . etc. that work at a specific wavelength. Therefore, a coil device can be connected to only a certain set of connectors or coil devices. Therefore, each coil device and/or connector can be color-coded. Alternatively or additionally, the connectors can have a form-coding, for example keyhole forms so that a coil device or connector that cannot be connected to a certain coil device or connector have different shapes and mechanically does not fit.

Figure 11:
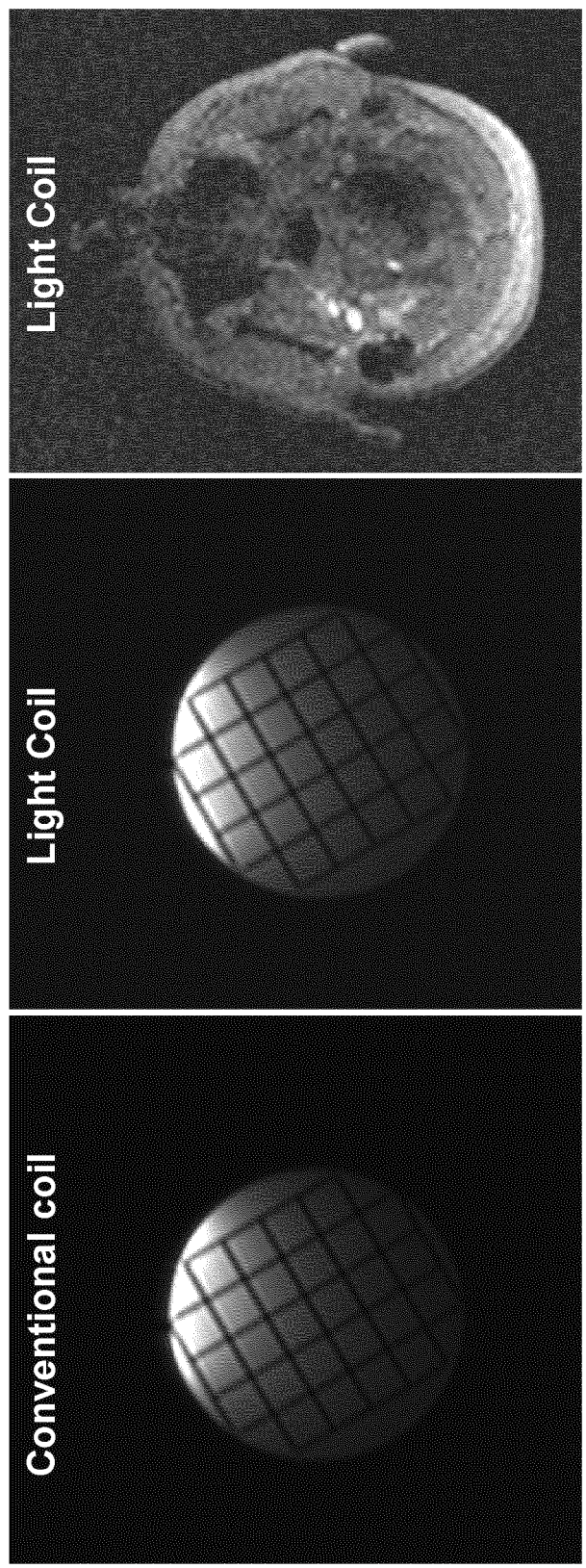

FIG. 11 shows MR images of a resolution phantom acquired using a conventional coil element (A) and an coil device according to an embodiment of a coil device (B). A transverse slice from the head of a healthy volunteer using an embodiment of a coil device with optical power transmission and optical detuning acquired with a 1.1s-long 2D GRE sequence (C).

Many modifications and other embodiments of the invention set forth herein will come to mind to the one skilled in the art to which the invention pertains having the benefit of the teachings presented in the foregoing description and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

LIST OF REFERENCE SIGNS 1 coil array
2 power supply device
3 signal receiving device
4, 4' coil device
5 light source
6 multiplexer
7 optical connector
8 optical fiber (power)
9 wavelength extraction element
10 object
11 multiplexer
12 optical connector (signal receiving device)
13 optical fiber (signal)
14 MRI room
15 receiver channel
16, 16' power connector
17, 17' signal connector
18 second power connector
19 second signal connector
20 plug
21 socket
22 radio frequency coil
23 tuning/matching circuit
24 pre-amplifier 25 de-modulator
26 digitizer
27 electro to optical converter
28 optical to electro converter
29 division multiplexer
30 fixation element
31 reflecting/absorbing element
32 low-power, low-noise, low-input-impedance amplifier

The invention claimed is:

1. A coil device (4) for magnetic resonance imaging and/or magnetic resonance spectroscopy comprising at least one radio frequency coil (22), at least one optical power connector (16) connectable to a corresponding optical power connector (16') of a second coil device (4'), at least one optical signal connector (17) connectable to a corresponding optical signal connector (17') of said second coil device (4') and at least one fixation element (30) for physically connecting said coil device (4) to said second coil device (4').

2. The coil device (4) according to claim 1, further comprising a second optical power connector (16') connectable to an optical power supply device (2) and/or a second optical signal connector (17') connectable to an optical signal receiving device (3).

3. The coil device (4) according to claim 2, wherein said optical power connector (16) and/or said optical signal connector (17) are configured to constitute said fixation element (30), and/or
wherein said coil device (4) comprises a color-coding and/or said optical power connector (16) and/or said optical signal connector (17) comprise a form-coding.

4. The coil device (4) according to claim 1, wherein said optical power connector (16) and/or said optical signal connector (17) are configured to constitute said fixation element (30), and/or
wherein said coil device (4) comprises a color-coding and/or said optical power connector (16) and/or said optical signal connector (17) comprise a form-coding.

5. The coil device (4) according to of claims claim 1, further comprising at least one wavelength extraction element (9), for example a wavelength splitter or a dichroitic mirror, and/or at least one division multiplexer (29),
and/or further comprising at least one electrical to optical converter (27), for example a photo-diode, and/or at least one optical to electrical converter (28), for example a light emitting diode.

6. The coil device (4) according to claims 1, further comprising at least one digitizer (26) and/or at least one de-modulator (25) and/or at least one pre-amplifier (24) and/or at least one tuning and matching circuit (23),
and/or further comprising a reflecting element (31), for example a mirror, or an absorbing element (31), for example a beam dump, preferably a beam block or a beam trap,
and/or further comprising an active detuning element, for example a positive intrinsic negative diode (PIN-Diode) or a photo field effect transistor (photoFET).

7. The coil device (4) according to claim 6, wherein the pre-amplifier (24) is a low-power, low-noise, low-input-impedance amplifier (32), preferably a two stage low-power, low-noise, low-input-impedance amplifier comprising a high electron mobility transistor (HEMT) for the first stage and bipolar junction transistor (BJT) for the second stage.

8. The coil device (4) according to claims 1, wherein said at least one radio frequency coil (22) is designed for transmitting operations and/or for receiving operations.

9. A coil array (1) comprising at least two coil devices (4) connected to each other, wherein each coil device (4) comprises at least one radio frequency coil (22), at least one optical power connector (16) connectable to a corresponding optical power connector (16') of a second coil device (4'), at least one optical signal connector (17) connectable to a corresponding optical signal connector (17') of said second coil device (4') and at least one fixation element (30) for physically connecting said coil device (4) to said second coil device (4').

10. A power supply device (2) for a coil device (4) for magnetic resonance imaging and/or magnetic resonance spectroscopy comprising at least two light sources (5) emitting light of different optical wavelength, a multiplexer (6) and a single optical connector (7) connectable to a corresponding optical power connector (16) of said coil device (4);
wherein the coil device (4) preferably comprises at least one radio frequency coil (22), at least one optical power connector (16) connectable to a corresponding optical power connector (16') of a second coil device (4'), at least one optical signal connector (17) connectable to a corresponding optical signal connector (17') of said second coil device (4') and at least one fixation element (30) for physically connecting said coil device (4) to said second coil device (4').

11. A signal receiving device (3) for a coil device (4), wherein the signal receiving device (3) comprises a multiplexer (11), a single optical connector (12), connectable to a corresponding optical signal connector (17) of said coil device (4) and at least two receiver channels (15) being directly or indirectly connected to said multiplexer (11);
wherein the coil device (4) preferably comprises at least one radio frequency coil (22), at least one optical power connector (16) connectable to a corresponding optical power connector (16') of a second coil device (4'), at least one optical signal connector (17) connectable to a corresponding optical signal connector (17') of said second coil device (4') and at least one fixation element (30) for physically connecting said coil device (4) to said second coil device (4').

12. An apparatus for magnetic resonance imaging and/or magnetic resonance spectroscopy comprising:
a coil array (1) comprising at least two coil devices (4) connected to each other, wherein each coil device (4) comprises at least one radio frequency coil (22), at least one optical power connector (16) connectable to a corresponding optical power connector (16') of a second coil device (4'), at least one optical signal connector (17) connectable to a corresponding optical signal connector (17') of said second coil device (4') and at least one fixation element (30) for physically connecting said coil device (4) to said second coil device (4');
a power supply device (2), for the coil devices (4) comprising at least two light sources (5) emitting light of different optical wavelength, a multiplexer (6) and a single optical connector (7) connectable to a corresponding optical power connector (16) of said coil device (4); and
a signal receiving device (3) for the coil devices (4) comprising a multiplexer (11), a single optical connector (12), connectable to a corresponding optical signal connector (17) of said coil device (4) and at least two receiver channels (15) being directly or indirectly connected to said multiplexer (11).

13. The apparatus according to claim 12, wherein one of said coil devices (4) of said coil array (1) is designed as a main coil device connected to said power supply device (2) and said signal receiving device (3), and/or wherein at least one of said coil devices (4) of said coil array (1) is designed as an intermediate coil device connected to said main coil device, preferably wherein one of said coil devices (4) is designed as an end coil device being connected to said main coil device and/or to said intermediate coil device.

14. The apparatus according to claim 13, wherein said coil array (1) is connected to said power supply device (2) with a single optical fiber (8) and/or wherein said coil array (4) is connected to said signal receiving device (3) with a single optical fiber (13).

15. The apparatus according to claim 12, wherein said coil array (1) is connected to said power supply device (2) with a single optical fiber (8) and/or wherein said coil array (4) is connected to said signal receiving device (3) with a single optical fiber (13).

16. A method for performing magnetic resonance imaging and/or magnetic resonance spectroscopy, preferably by using an apparatus according to claim 12, comprising the following steps:
- assembling a coil array (1) by connecting at least two coil devices (4) such that said coil array (1) is configured in accordance with the size and/or shape of an object (10) to be inspected,
- connecting an optical power supply device (2) and an optical signal receiving device (3) to said coil array (1), and
- performing said magnetic resonance imaging and/or magnetic resonance spectroscopy.

17. The method according to claim 16, wherein said power supply device (2) comprises at least one light source (5) and wherein said at least one light source (5) is activated only during a receive cycle.

* * * * *